US012298494B2

(12) United States Patent
Hane et al.

(10) Patent No.: US 12,298,494 B2
(45) Date of Patent: May 13, 2025

(54) SCANNING MIRROR AND MANUFACTURING METHOD FOR SCANNING MIRROR (71) Applicant: TOHOKU UNIVERSITY, Sendai (JP)

(72) Inventors: Kazuhiro Hane, Sendai (JP); Takashi Sasaki, Sendai (JP); Yuki Fujita, Sendai (JP)

(73) Assignee: TOHOKU UNIVERSITY, Miyagi (JP)

( * ) Notice: Subject to any disclaimer, the term of this patent is extended or adjusted under 35 U.S.C. 154(b) by 789 days.

(21) Appl. No.: 17/417,981

(22) PCT Filed: Apr. 27, 2020

(86) PCT No.: PCT/JP2020/018008
§ 371 (c)(1),
(2) Date: Jun. 24, 2021

(87) PCT Pub. No.: WO2020/241153
PCT Pub. Date: Dec. 3, 2020

(65) Prior Publication Data
US 2022/0066198 A1 Mar. 3, 2022

(30) Foreign Application Priority Data

May 25, 2019 (JP) ................................. 2019-098158

(51) Int. Cl.
G02B 26/08 (2006.01)
B81B 3/00 (2006.01)
(Continued)

(52) U.S. Cl.
CPC ........ *G02B 26/0841* (2013.01); *B81B 3/0018* (2013.01); *C23C 16/325* (2013.01);
(Continued)

(58) Field of Classification Search
CPC .... G02B 26/10; G02B 26/08; G02B 26/0833; G02B 26/0841; G02B 26/105;
(Continued)

(56) References Cited

U.S. PATENT DOCUMENTS 6,891,650 B2 * 5/2005 Mizuno ................ B01D 53/885
310/309
7,553,686 B2 * 6/2009 George .............. G02B 26/0833
359/223.1
(Continued)

FOREIGN PATENT DOCUMENTS

CN 101219599 A * 7/2008 .......... B41J 2/14314
EP 3 015 901 A1 5/2016
(Continued)

OTHER PUBLICATIONS

E.K. Baumert et al. "Fatigue-Resistant Silicon Films Coated With Nanoscale Alumina Layers". Scripta Materialia, 2011, vol. 65, issue 7, pp. 596-599.
(Continued)

Primary Examiner — Jyotsna V Dabbi
(74) Attorney, Agent, or Firm — Oliff PLC (57) ABSTRACT A scanning mirror that prevents the oxidation or hydroxylation of a torsion bar, thereby suppressing deterioration of the torsion bar and a manufacturing method for the scanning mirror. The scanning mirror has a torsion bar provided so as to support a mirror portion and of which the surface is covered with an atomic layer deposition (ALD) layer. The scanning mirror is configured such that the mirror portion can be rotated around an axis that extends along the torsion bar when torsional force is applied to the torsion bar. The scanning mirror is manufactured by forming the mirror portion and the torsion bar and then forming the ALD layer on at least the surface of the torsion bar.

7 Claims, 5 Drawing Sheets (51) Int. Cl.
*C23C 16/32* (2006.01)
*C23C 16/34* (2006.01)
*C23C 16/40* (2006.01)
*C23C 16/455* (2006.01)

(52) U.S. Cl.
CPC .......... *C23C 16/345* (2013.01); *C23C 16/403* (2013.01); *C23C 16/45555* (2013.01); *B81B 2201/042* (2013.01)

(58) Field of Classification Search
CPC ....... G02B 26/0816; B81B 3/00; B81B 3/004; B81B 3/0067; B81B 3/0018; B81B 3/0078; B81B 3/0048; B81B 3/0059; B81B 2203/0154; B81B 2201/04; B81B 2201/045; B81B 2201/042; B81B 7/0025; B81B 7/0029; B81C 1/00; B81C 1/00785; B81C 1/00793; B81C 1/00809; C23C 16/325; C23C 16/345; C23C 16/403; C23C 16/45555
USPC ..................................................... 359/223.1
See application file for complete search history.

(56) References Cited

U.S. PATENT DOCUMENTS

| | | |
|---|---|---|
| 2007/0211257 A1 | 9/2007 | Kearl et al. |
| 2013/0129940 A1 | 5/2013 | Xiao et al. |
| 2018/0186625 A1 | 7/2018 | Jacobs et al. |

FOREIGN PATENT DOCUMENTS

| | | | |
|---|---|---|---|
| JP | 2002-40353 A | | 2/2002 |
| JP | 3934578 B2 | | 6/2007 |
| JP | 5321740 B2 | | 10/2013 |
| JP | 5640420 B2 | | 12/2014 |
| JP | 6018926 B2 | | 11/2016 |
| JP | 2017102232 A | * | 6/2017 |
| JP | 2017-171664 A | | 9/2017 |
| WO | 2017/006425 A1 | | 1/2017 |

OTHER PUBLICATIONS

T. Izawa, et al. "Nonlinearity Compensation of Micro-Mirror Hard-Spring by Electrostatic Combs," Transducers, 2017, pp. 1987-1990.
Jun. 24, 2022 Search Report issued in European Patent Application No. 20814367.7.
Jun. 9, 2020 International Search Report issued in International Patent Application No. PCT/JP2020/018008.
Jun. 9, 2020 Written Opinion issued in International Patent Application No. PCT/JP2020/018008.
S. Gu-Stoppel et al. "High Speed Piezoelectric Microscanners With Large Deflection Using Mechanical Leverage Amplification". Procedia Engineering, 2012, vol. 47, pp. 56-59.
Shanshan Gu-Stoppel et al. "PZT-Actuated and -Sensed Resonant Micromirrors With Large Scan Angles Applying Mechanical Leverage Amplification for Biaxial Scanning". Micromachines, 2017, vol. 8, No. 215, pp. 1-14.
Wenlei Zhang et al. "Fracture Strength of Silicon Torsional Mirror Resonators Fully Coated With Submicrometer-Thick PECVD DLC Film". Sensors and Actuators A: Physical, 2019, vol. 286, pp. 28-34.
M. Budnitzki et al. "The Influence of Nanoscale Atomic-Layer-Deposited Alumina Coating on the Fatigue Behavior of Polycrystalline Silicon Thin Films". Applied Physics Letters, 2009, vol. 94, pp. 141906.
P.F. Carcia et al. "Permeation Measurements and Modeling of Highly Defective Al2O3 Thin Films Grown by Atomic Layer Deposition on Polymers". Applied Physics Letters, 2010, vol. 97, pp. 221901.
Feb. 23, 2024 Office Action issued in Chinese Patent Application No. 202080007573.0.

* cited by examiner

SCANNING MIRROR AND MANUFACTURING METHOD FOR SCANNING MIRROR

FIELD OF THE INVENTION

The present invention relates to a scanning mirror and a manufacturing method for the scanning mirror.

DESCRIPTION OF RELATED ART

Conventionally, in devices such as laser projectors, laser displays, and OCT probes equipped with optical coherence tomography (OCT) functions, those using a MEMS (Micro Electro Mechanical Systems) microscanner manufactured by a microfabrication technology have been developed in order to reduce the size and facilitate portability (see, for example, Patent Literatures 1 to 4). This microscanner has a scanning mirror which includes a mirror portion that reflects a laser beam and a torsion bar that supports the mirror portion, and which applies a torsional force to the torsion bar to rotate the mirror portion to scan the laser beam two-dimensionally.

In order to improve the performance of such a MEMS microscanner, it is necessary to drive the scanning mirror at a higher speed, a higher scanning angle, and lower power consumption. Therefore, a PZT (lead-zirconate-titanate)-driven microscanner in which the rotation angle of a mirror portion is increased by a high amplification function achieved by a machine which is a combination of a torsion bar and a cantilever has been developed (see, for example, Non-Patent Literature 1 or 2).

Further, in order to increase the torsional fracture strength of a torsion bar to improve the durability, a structure in which the surface of a mirror portion and the torsion bar is covered with a diamond-like carbon (DLC) film using plasma CVD (plasma enhanced chemical vapor deposition) has been proposed (see Non-Patent Literature 3). According to this structure, the torsional fracture strength can be improved by 11.1% to 30.0%.

Researches have been conducted to examine the effects of an aluminum oxide ($Al_2O_3$) layer formed on the surface of a polycrystalline silicon film or the surface of a polymer layer using an atomic layer deposition (ALD) method (see, for example, Non-Patent Literature 4 or 5). However, in these researches, an aluminum oxide layer is not formed on the surface of a torsion bar of a scanning mirror.

CITATION LIST

Patent Literature 1: Japanese Patent No. 3934578
Patent Literature 2: Japanese Patent No. 5321740
Patent Literature 3: Japanese Patent No. 5640420
Patent Literature 4: Japanese Patent No. 6018926
Non-Patent Literature 1: S. Gu-Stoppel, D. Kaden, H. J. Quenzer, U. Hofmann, W. Benecke, "High speed piezoelectric microscanners with large deflection using mechanical leverage amplification", Procedia Engineering, 2012, 47, p. 56-59
Non-Patent Literature 2: S. Gu-Stoppel, T. Giese, H. J. Quenzer, U. Hofmann, W. Benecke, "PZT-Actuated and -Sensed Resonant Micromirrors with Large Scan Angles Applying Mechanical Leverage Amplification for Biaxial Scanning", Micromachines, 2017, 8, 215
Non-Patent Literature 3: W. Zhang, K. Obitani, Y. Hirai, T. Tsuchiya, O. Tabata, "Fracture strength of silicon torsional mirror resonators fully coated with submicrometer-thick PECVD DLC film", Sensors and Actuators A: Physical, 2019, 286, p. 28-34
Non-Patent Literature 4: M. Budnitzki, O. Pierron, "The influence of nanoscale atomic-layer-deposited alumina coating on the fatigue behavior of polycrystalline silicon thin films", Applied Physics Letters, 2009, 94, 141906
Non-Patent Literature 5: P. F. Carcia, R. S. McLean, M. H. Reilly, "Permeation measurements and modeling of highly defective $Al_2O_3$ thin films grown by atomic layer deposition on polymers", Applied Physics Letters, 2010, 97, 221901

SUMMARY OF THE INVENTION

In conventional scanning mirrors as described in Patent Literatures 1 to 4 and Non-Patent Literatures 1 and 2, the oxidization and hydroxylation of the torsion bar progresses due to the adhesion of water and oxygen to the surface of the torsion bar made of silicon or the like. Therefore, there is a problem that the torsion bar deteriorates quickly. Further, in the scanning mirror described in Non-Patent Literature 3, since a DLC film is formed on the surface of the torsion bar, the progress of oxidation and hydroxylation of the torsion bar can be delayed. However, since plasma CVD is used for forming the DLC film, there is a problem that the adhesion of water and oxygen to the surface of the torsion bar cannot be completely prevented, and the deterioration of the torsion bar cannot be suppressed.

The present invention has been made in view of such a problem, and an object thereof is to provide a scanning mirror and a manufacturing method for the scanning mirror capable of preventing oxidation and hydroxylation of a torsion bar, thereby suppressing deterioration of the torsion bar.

In order to achieve the above object, a scanning mirror according to the present invention includes a mirror portion; and a torsion bar provided so as to support the mirror portion and of which the surface is covered with an ALD layer, wherein the scanning mirror is configured such that the mirror portion can be rotated around an axis extending along the torsion bar when torsional force is applied to the torsion bar.

In the scanning mirror according to the present invention, since the surface of the torsion bar is covered with the ALD layer, the ALD layer can be brought into close contact with the surface of the torsion bar to cover irregularities and fine cracks occurring when the torsion bar is formed. Further, since the ALD layer is formed by an atomic layer deposition (ALD) method, the ALD layer is denser than a deposition layer by plasma CVD and has no pinholes. Therefore, in the scanning mirror according to the present invention, the ALD layer can almost completely prevent moisture and oxygen from adhering to the surface of the torsion bar. As a result, oxidation and hydroxylation of the torsion bar can be prevented, whereby deterioration of the torsion bar can be suppressed. Further, in the scanning mirror according to the present invention, the torsional fracture strength of the torsion bar can be increased by the ALD layer.

The scanning mirror according to the present invention preferably has an electrostatic actuator having a pair of electrodes of which the surface is covered with the ALD layer, the electrostatic actuator being provided to be deformable so that torsional force is applied to the torsion bar when a voltage is applied between the electrodes. In this case, the ALD film can prevent the oxidation and hydroxylation of the electrodes as well as the torsion bar, whereby the deterioration of the electrodes can be suppressed. Further, by configuring the electrostatic actuator to have a high amplification function achieved by a machine, the scanning mirror can be driven at a higher speed, a higher scanning angle, and lower power consumption.

A manufacturing method for a scanning mirror according to the present invention is a manufacturing method for a scanning mirror configured such that a mirror portion can be rotated around an axis extending along a torsion bar when torsional force is applied to the torsion bar provided so as to support the mirror portion, the manufacturing method comprising: forming the ALD layer on a surface of the torsion bar by an atomic layer deposition method after the mirror portion and the torsion bar are formed.

The manufacturing method for the scanning mirror according to the present invention can suitably manufacture the scanning mirror according to the present invention. In the manufacturing method for a scanning mirror according to the present invention, since the ALD layer is formed on the surface of the torsion bar by an atomic layer deposition method, the formed ALD layer can make close contact with the surface of the torsion bar to cover irregularities and fine cracks occurring when the torsion bar is formed. In the manufacturing method for a scanning mirror according to the present invention, the formed ALD layer can almost completely prevent moisture and oxygen from adhering to the surface of the torsion bar. As a result, oxidation and hydroxylation of the torsion bar can be prevented, whereby deterioration of the torsion bar can be suppressed. Further, the formed ALD layer can increase the torsional fracture strength of the torsion bar.

In the manufacturing method for the scanning mirror according to the present invention, the scanning mirror may have an electrostatic actuator provided to be deformable so that torsional force is applied to the torsion bar when a voltage is applied between a pair of electrodes, and the ALD layer may be formed at least on a surface of the torsion bar and surfaces of the electrodes of the electrostatic actuator by an atomic layer deposition method after the mirror portion, the torsion bar, and the electrostatic actuator are formed. In this case, the formed ALD film can prevent the oxidation and hydroxylation of the electrodes as well as the torsion bar, whereby the deterioration of the electrodes can be suppressed. Further, by forming an electrostatic actuator having a high amplification function achieved by a machine, it is possible to manufacture a scanning mirror that can be driven at a higher speed, a higher scanning angle, and lower power consumption.

In the scanning mirror and the manufacturing method for the scanning mirror according to the present invention, the ALD layer may be made of any material as long as it enhances the strength of the torsion bar against fatigue, and for example, may be made of any one or more of an aluminum oxide ($Al_2O_3$), an aluminum nitride (AlN), a silicon nitride ($Si_3N_4$), a silicon carbide (SiC), a gallium nitride (GaN). Further, the ALD layer may be made of an insulator. In this case, by covering the electrodes of the electrostatic actuator with the ALD layer, a short circuit due to contact between the electrodes can be prevented, and the movable range of the electrostatic actuator can be extended. Further, when the ALD layer is made of an aluminum oxide which is an insulator, the dielectric constant of each electrode can be increased, and the electrostatic force generated by the electrostatic actuator can be increased.

In the scanning mirror and the manufacturing method for the scanning mirror according to the present invention, it is preferable that the mirror portion and the torsion bar are made of silicon (Si). Further, when the scanning mirror has an electrostatic actuator, it is preferable that the electrostatic actuator is also made of silicon. In particular, in the scanning mirror according to the present invention, it is preferable that the scanning mirror is MEMS manufactured by silicon microfabrication technology. Further, in the manufacturing method for the scanning mirror according to the present invention, it is preferable to manufacture the scanning mirror by a silicon microfabrication technology.

In the scanning mirror and the manufacturing method for the scanning mirror according to the present invention, the ALD layer preferably has a thickness of 0.5 nm to 200 nm. In this case, deterioration of the torsion bar and the electrodes can be suppressed without hindering the movement of the torsion bar.

According to the present invention, it is possible to provide a scanning mirror and a manufacturing method for the scanning mirror capable of preventing oxidation and hydroxylation of a torsion bar, thereby suppressing deterioration of the torsion bar.

DETAILED DESCRIPTION OF THE INVENTION

Hereinafter, an embodiment of the present invention will be described with reference to the drawings.

FIGS. 1 to 6 illustrate a scanning mirror and a manufacturing method for the scanning mirror according to an embodiment of the present invention.

The scanning mirror according to the embodiment of the present invention is manufactured using an SOI (Silicon on Insulator) wafer having a BOX layer made of $SiO_2$ between a handle layer made of Si and a device layer. In the SOI wafer, the handle layer and the device layer are insulated by the BOX layer.

Figure 1:
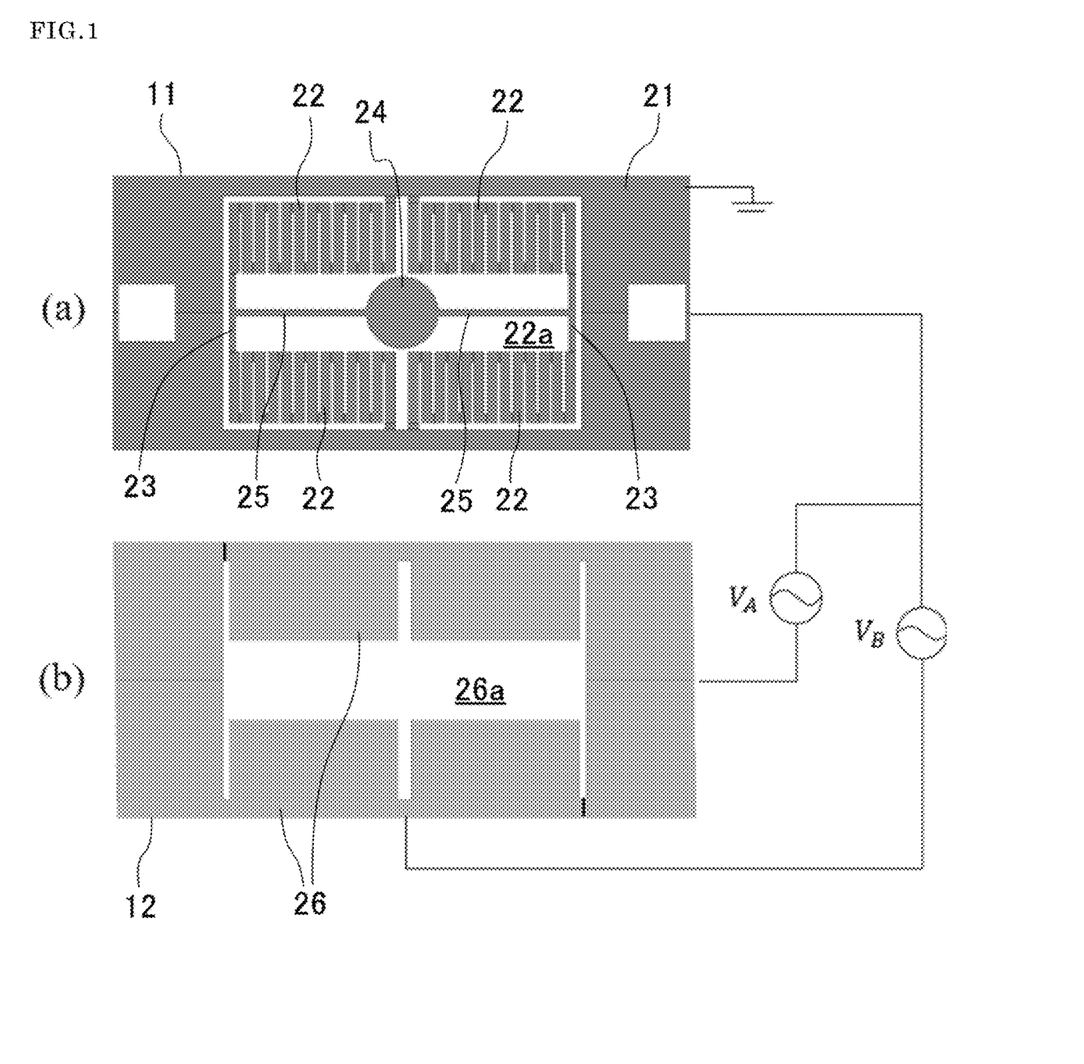
FIG. 1 is a plan view illustrating each portion of a scanning mirror according to an embodiment of the present invention, in which (a) illustrates a mirror portion formed by processing a device layer and (b) illustrates application electrodes formed by processing a handle layer.

As illustrated in FIG. 1, the scanning mirror according to the embodiment of the present invention includes a support electrode 21, four beam portions 22, two connecting bars 23, a mirror portion 24, two torsion bars 25, and two application electrodes 26. The support electrode 21, the beam portions 22, the connecting bars 23, the mirror portion 24, and the torsion bars 25 are formed by processing the device layer 11. The application electrodes 26 are formed by processing the handle layer 12.

As illustrated in FIG. 1(a), the support electrode 21 has a rectangular frame shape. The four beam portions 22 each are formed so that a plurality of elongated rectangular plates are arranged side by side in parallel in the width direction, and the rectangular plates are alternately connected to both neighboring rectangular plates at different ends. The beam portions 22 are arranged so that two beam portions 22 are arranged side by side along a pair of long sides of a rectangular inner edge 21a of the support electrode 21, and the two beam portions 22 extend up to ends on different sides from the central portions of the corresponding long sides to be arranged with a gap between the beam portions and the corresponding long sides. The beam portions 22 are arranged so that an elongated rectangular mirror hole 22a is formed between two beam portions arranged along one long side and two beam portions arranged along the other long side. Further, the beam portions 22 are arranged so that the rectangular plates are parallel to the short side of the inner edge 21a of the support electrode 21, and are connected to the support electrode 21 on the central portion side of the long side of the inner edge 21a.

The two connecting bars 23 are provided so as to connect the beam portions 22 facing each other with the mirror hole 22a interposed therebetween on one short side and the other short side of the inner edge 21a of the support electrode 21, respectively. The connecting bars 23 connect the beam portions 22 to each other on each short side of the inner edge 21a. The mirror portion 24 has a disk shape and is arranged in the central portion of the mirror hole 22a so as not to come into contact with the beam portions 22. The two torsion bars 25 are parallel to each long side of the inner edge 21a of the support electrode 21, and are each provided so as to connect the central portion of each connecting bar 23 and the mirror portion 24. As a result, the torsion bars 25 support the mirror portion 24.

As illustrated in FIG. 1(a), the support electrode 21, the beam portions 22, the connecting bars 23, the mirror portion 24, and the torsion bars 25 have a shape that is bilaterally symmetrical with respect to the center line parallel to each long side of the inner edge 21a of the support electrode 21 and is also bilaterally symmetrical with respect to the center line parallel to each short side of the inner edge 21a of the support electrode 21.

As illustrated in FIG. 1(b), the application electrodes 26 are provided in portions facing the support electrode 21 and the beam portions 22, and a rectangular drive hole 26a corresponding to the mirror hole 22a is formed at the center thereof. One of the application electrodes 26 is provided so as to face a region on one long side of the inner edge 21a of the support electrode 21, two beam portions 22 along the long side thereof, and a region on one short side of the inner edge 21a of the support electrode 21. The other application electrode 26 is provided so as to face a region on the other long side of the inner edge 21a of the support electrode 21, two beam portions 22 along the long side thereof, and a region on the other short side of the inner edge 21a of the support electrode 21. The application electrodes 26 are not electrically connected.

In the scanning mirror according to the embodiment of the present invention, the support electrode 21, the beam portions 22, the connecting bars 23, the mirror portion 24, and the torsion bars 25 formed on the device layer 11 and the application electrodes 26 formed on the handle layers 12 are arranged at intervals by the BOX layer and are insulated by the BOX layer. In the scanning mirror according to the embodiment of the present invention, the support electrode 21, the beam portions 22, and the application electrodes 26 form an electrostatic actuator.

In the scanning mirror according to the embodiment of the present invention, the surfaces of the support electrode 21, the beam portions 22, the connecting bars 23, the mirror portion 24, the torsion bars 25, and the application electrodes 26 are covered with an ALD layer. In a specific example illustrated in FIG. 1, although the ALD layer is made of an aluminum oxide ($Al_2O_3$) which is an insulator, the ALD layer may be made of an aluminum nitride (AlN), a silicon nitride ($Si_3N_4$), a silicon carbide (SiC), a gallium nitride (GaN), or the like in addition to aluminum oxide ($Al_2O_3$).

As illustrated in FIG. 1, the scanning mirror according to the embodiment of the present invention is configured such that the mirror portion 24 can be rotated as follows. That is, by grounding the support electrode 21 and applying an AC voltage shifted in phase by $\pi$ to the application electrodes 26, the beam portion 22 facing one application electrode 26 and the beam portion 22 facing the other application electrode 26 are deformed with a phase shift of $\pi$. As a result, the connecting bars 23 are similarly deformed, and a torsional force in the same direction is applied to the torsion bars 25. Due to this torsional force, the mirror portion 24 is rotated inside the mirror hole 22a and the drive hole 26a around the axis along the torsion bars 25.

Figure 2:
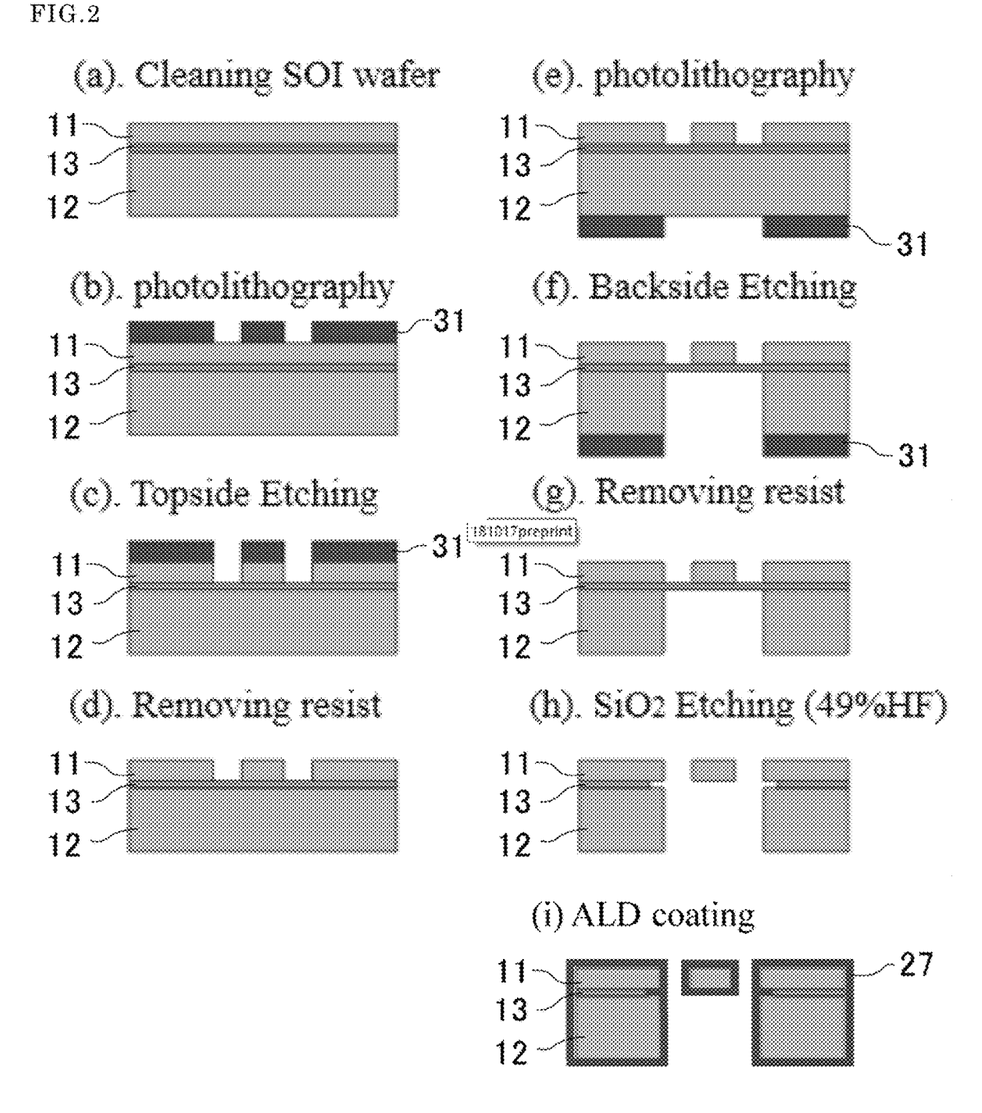
FIG. 2 is a side view illustrating a manufacturing method for the scanning mirror according to the embodiment of the present invention.

The scanning mirror according to the embodiment of the present invention can be suitably manufactured by the manufacturing method for the scanning mirror according to an embodiment of the present invention. That is, as illustrated in FIG. 2, in the manufacturing method for the scanning mirror according to the embodiment of the present invention, first, cleaning of a SOI wafer is performed (see FIG. 2(a)), and a registry polymer 31 is applied to the surface of the device layer 11 of the SOI wafer, and patterning is performed by photolithography using a mask pattern (see FIG. 2(b)). Etching of the device layer 11 is performed by a deep RIE (Deep RIE) apparatus (see FIG. 2(c)). After etching, the registry polymer 31 is removed with a stripping solution (see FIG. 2(d)). As a result, the support electrode 21, the beam portions 22, the connecting bars 23, the mirror portion 24, and the torsion bars 25 are formed on the device layer 11.

Subsequently, in the same manner, the registry polymer 31 is applied to the surface of the handle layer 12 of the SOI wafer and patterning is performed by photolithography (see FIG. 2(e)), and etching of the handle layer 12 is performed by deep RIE (see FIG. 2(f)). After that, the registry polymer 31 is removed (see FIG. 2 (g)). As a result, the application electrodes 26 are formed. Subsequently, the BOX layer 13 in the range of the mirror hole 22a is etched with an etching solution (see FIG. 2(h)). After that, the ALD layer 27 is formed so as to cover the entire exposed surface by the atomic layer deposition method (see FIG. 2(i)).

In a specific example illustrated in FIG. 2, the thickness of the handle layer 12 of the SOI wafer is 200 μm, the thickness of the BOX layer 13 is 1 μm, and the thickness of the device layer 11 is 90 μm. The registry polymer 31 is OFPR 800-LB 200 cp. The deep RIE apparatus is manufactured by STS, and the etching gas of the deep RIE is $SF_6$ gas, and the passivation gas is $C_4F_8$ gas. The stripping solution is "EKC265 (registered trademark)" manufactured by DuPont. The etching solution of the BOX layer 13 is an HF solution having a concentration of 49%. The ALD layer 27 is made of aluminum oxide ($Al_2O_3$).

As described above, the scanning mirror according to the embodiment of the present invention can be manufactured as MEMS by a silicon microfabrication technology using the manufacturing method for the scanning mirror according to the embodiment of the present invention. In the scanning mirror of the embodiment of the present invention, since the surfaces of the torsion bar 25, the support electrode 21, and the application electrodes 26 are covered with the ALD layer 27, the ALD layer 27 can be brought into close contact with the surfaces thereof to cover the irregularities and fine cracks occurring when these components are formed. Further, in the scanning mirror of the embodiment of the present invention, the ALD layer 27 can almost completely prevent moisture and oxygen from adhering to the surfaces of the torsion bar 25, the support electrode 21, and the application electrodes 26. As a result, oxidation and hydroxylation of the torsion bar 25, the support electrode 21, and the application electrodes 26 can be prevented, and deterioration thereof can be suppressed. Further, in the scanning mirror according to the embodiment of the present invention, the torsional fracture strength of the torsion bar 25 can be increased by the ALD layer 27.

In the scanning mirror according to the embodiment of the present invention, since the electrostatic actuator composed of the support electrode 21, the beam portions 22, and the application electrodes 26 has a high amplification function achieved by a machine, the scanning mirror can be driven at a higher speed, a higher scanning angle, and lower power consumption. Further, in the scanning mirror of the embodiment of the present invention, since the ALD layer 27 is made of an aluminum oxide as an insulator, it is possible to prevent a short circuit due to contact between the support electrode 21 and the beam portions 22 and the application electrodes 26 and further extend the movable range of the electrostatic actuator. Further, since the ALD layer 27 is made of an aluminum oxide, the dielectric constant of the support electrode 21 and the application electrodes 26 can be increased, and the electrostatic force generated by the electrostatic actuator can be increased. Further, by driving the mirror unit 24 at a resonance frequency, the rotation angle of the mirror unit 24 can be further increased.

EXAMPLE 1

The scanning mirror according to the embodiment of the present invention illustrated in FIG. 1 was manufactured by the manufacturing method for the scanning mirror according to the embodiment of the present invention illustrated in FIG. 2. Three types of scanning mirrors in which 10 atomic layers, 400 atomic layers, and 800 atomic layers were formed by the ALD method were manufactured. Theoretically, since one layer is as thick as 1 angstrom (0.1 nm), the thicknesses of the ALD layers 27 of the scanning mirrors are 1 nm, 40 nm, and 80 nm, respectively. Further, in each of the manufactured scanning mirrors, the length $l_a$ of one beam portion 22 is 14,210 μm, the width $b_a$ of the beam portion 22 is 140 μm, the length $l_c$ from the connection end between each connecting bar 23 and each beam portion 22 to the connecting portion between each connecting bar 23 and each torsion bar 25 is 500 μm, and the width $b_c$ of each connecting bar 23 is 90 μm.

The manufacturing error of the scanning mirror was on the order of 0.1 μm. When the scanning mirror before the formation of the ALD layer 27 was measured by LVD (Laser Doppler Vibrometer; manufactured by Polytech), the resonance frequency was 43.3 Hz, the displacement of the end of the mirror portion 24 was 1,163 mm, and the optical scanning angle was 0.533 deg.

For the three types of manufactured scanning mirrors, the cross-section was observed with a scanning electron microscope (SEM) and the surface roughness was measured with a surface roughness measuring machine (manufactured by Zygo Corporation). In addition, the residual stress of the scanning mirror having 800 atomic layers was measured by a Raman spectroscope. The cross-sectional observation result of the SEM is illustrated in FIG. 3, the surface shape measurement result is illustrated in FIG. 4, and the residual stress measurement result is illustrated in FIG. 5.

Figure 3:
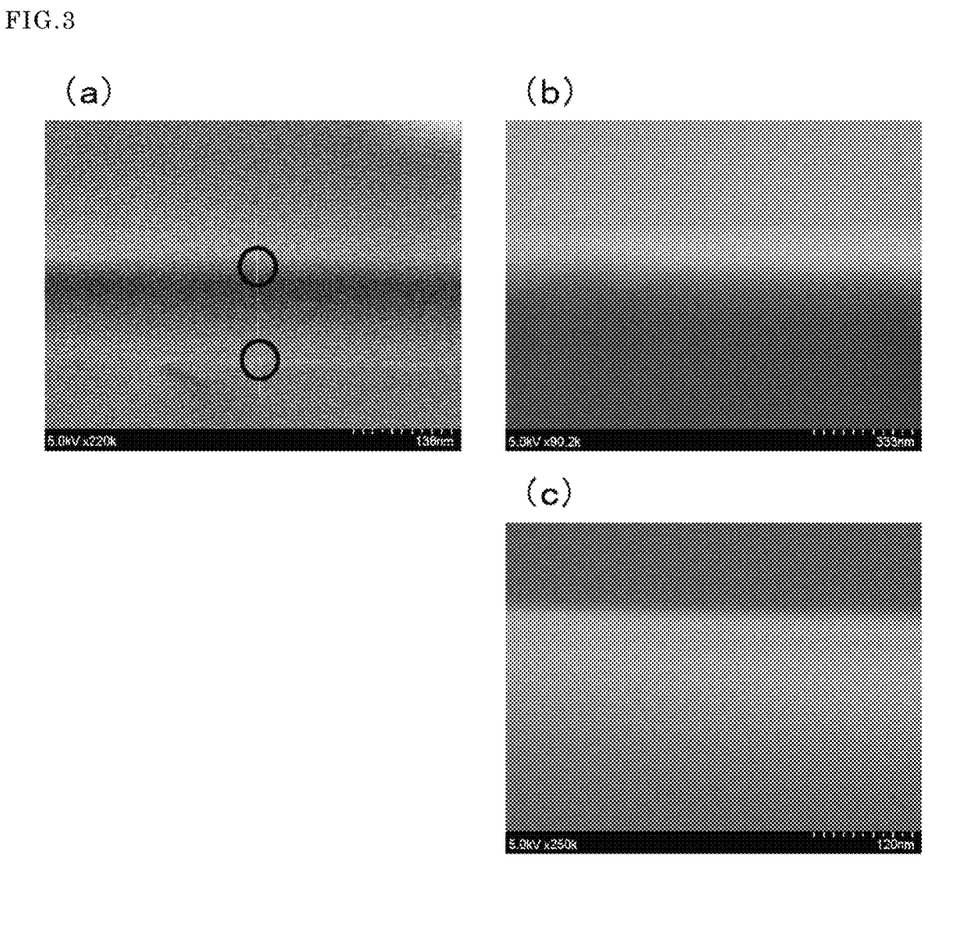
FIG. 3 illustrates scanning electron microscope (SEM) photographs of cross-sections of the scanning mirror according to the embodiment of the present invention when (a) 800 layers, (b) 400 layers, and (c) 10 layers of atomic layers are deposited by an ALD method.

As illustrated in FIG. 3(a), in the scanning mirror having 800 atomic layers, the ALD layer 27 (between the circles in the drawing) having a thickness of approximately 80 nm could be confirmed. However, as illustrated in FIGS. 3(b) and 3(c), the ALD layer 27 could not be clearly confirmed in the scanning mirrors having 10 and 400 atomic layers.

Figure 4:
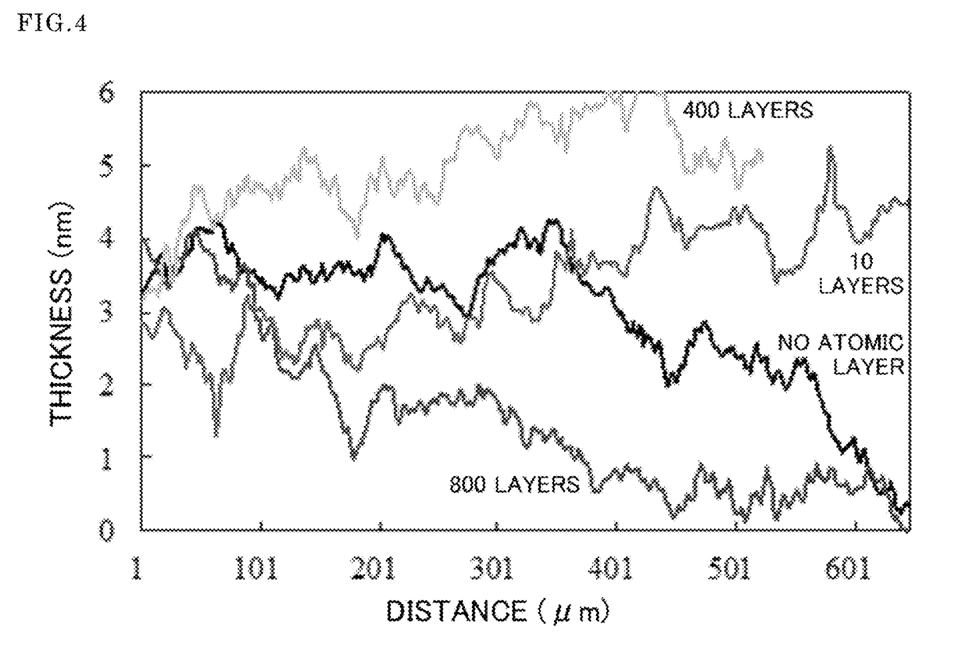
FIG. 4 is a graph illustrating the measurement results of the surface shape of the scanning mirror according to the embodiment of the present invention when 800 layers, 400 layers, and 10 atomic layers are deposited by the ALD method, and the surface shape of the atomic layers before the deposition.

As illustrated in FIG. 4, the scanning mirrors have fine irregularities with a height difference of several nm or less, but it was confirmed that the overall surface irregularities were within the range of approximately 5 nm. When the arithmetic mean roughness Ra of the surface roughness of each scanning mirror was obtained from these surface shapes, the scanning mirror having 800 atomic layers had Ra=0.00066, the scanning mirror having 400 atomic layers had Ra=0.00068, and the scanning mirror having 10 atomic layers had Ra=0.007796. From this result, it was confirmed that the thicker the ALD layer 27, the smaller the surface roughness and the more flat it became. Note that FIG. 4 also illustrates the surface shape of the scanning mirror before deposition of the atomic layer as a comparative example, and the arithmetic mean roughness thereof was Ra=0.00042.

Figure 5:
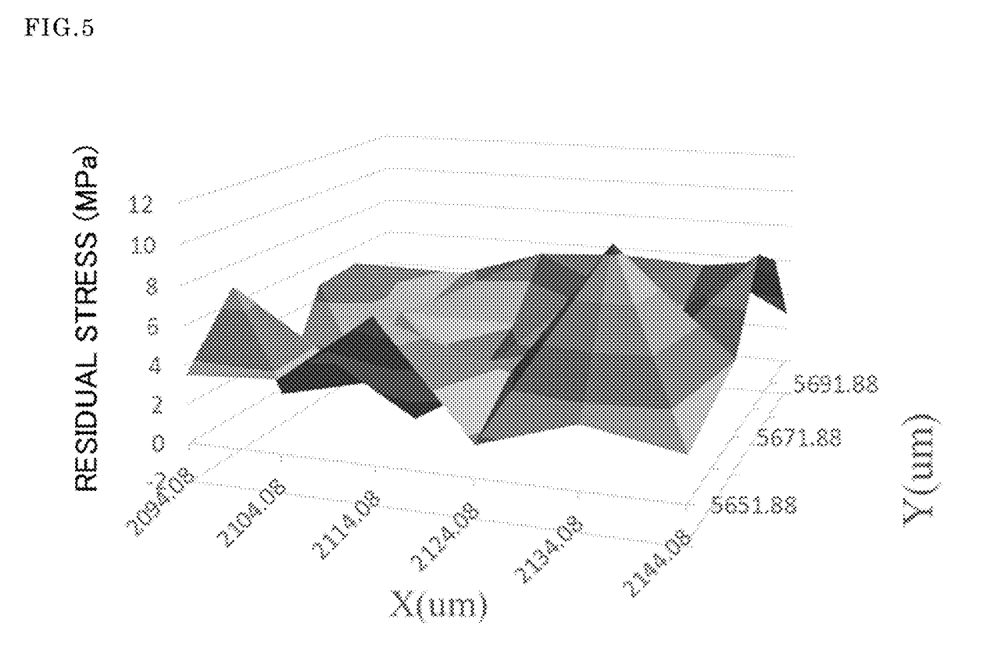
FIG. 5 is a graph illustrating a measurement result of residual stress when 800 atomic layers of the scanning mirror according to the embodiment of the present invention are deposited by the ALD method.

As illustrated in FIG. 5, it was confirmed that the residual stress was distributed in the scanning mirror having 800 atomic layers. It is considered that this residual stress was generated due to the temperature difference when the atomic layer was formed by the ALD method.

EXAMPLE 2

Figure 6:
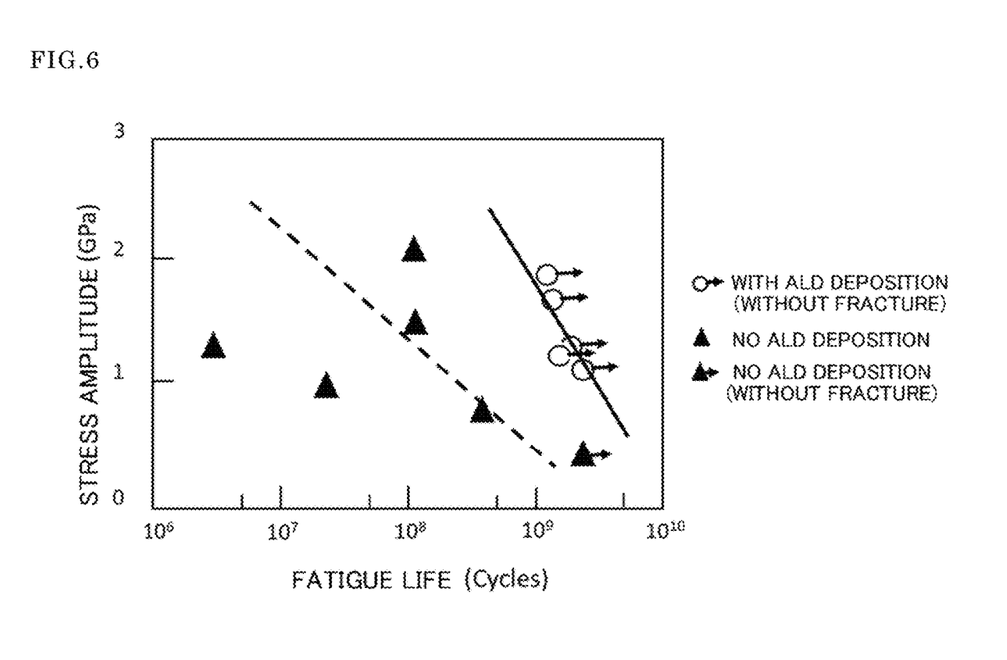
FIG. 6 is a graph illustrating the relationship between stress amplitude and fatigue life of a scanning mirror (with ALD deposition) according to the embodiment of the present invention and a scanning mirror without ALD deposition, which is a comparative example.

A scanning mirror in which an ALD layer made of an $Al_2O_3$ film was formed was manufactured by the manufacturing method for the scanning mirror according to the embodiment of the present invention illustrated in FIG. 2. The layer thickness of the ALD layer is 2.64 nm. An experiment was conducted in which a constant stress was repeatedly applied to this scanning mirror using a fatigue test device, and the presence of fracture within the measurement time was examined. The results of the experiment in which the applied stress was changed are plotted in a graph illustrating the relationship between the stress amplitude and the fatigue life (number of repetitions), and are illustrated in FIG. 6. For comparison, the same experiment was performed on a scanning mirror in which the ALD layer was not formed, and the results are also illustrated in FIG. 6.

The data marked with "→" in FIG. 6 is a scanning mirror that did not fracture within the measurement time, and indicates that the fatigue life is larger than the plotted value. As illustrated in FIG. 6, it was confirmed that the logarithmic value of the fatigue life decreased as the applied stress amplitude increased. Further, in the stress amplitude region where the scanning mirror illustrated in FIG. 6 is usually used, it was confirmed that the fatigue life of the scanning mirror having the ALD layer was extended by an order of magnitude or more as compared to a scanning mirror having no ALD layer even if the layer thickness is as thin as 2.64 nm.

REFERENCE SIGNS LIST

11 Device layer
12 Handle layer
13 BOX layer
21 Support electrode
21a Inner edge
22 Beam portion
22a Mirror hole
23 Connecting bar
24 Mirror portion
25 Torsion bar
26 Application electrode
26a Drive hole
27 ALD layer
31 Registry polymer

What is claimed is:

1. A scanning mirror comprising:
a support electrode having a rectangular frame shape;
four beam portions arranged so that two beam portions are arranged side by side along a pair of long sides of a rectangular inner edge of the support electrode and are connected to the support electrode on the central portion side of the long side of the inner edge;
two connecting bars provided so as to connect the beam portions facing each other on one short side and the other short side of the inner edge of the support electrode, respectively;
a mirror portion;
a torsion bar being parallel to each long side of the inner edge of the support electrode, and each provided so as to connect the central portion of each connecting bar and the mirror portion, and provided so as to support the mirror portion; and
two application electrodes provided in portions facing the support electrode and the beam portions, wherein
the surfaces of the beam portions, the connecting bars and the torsion bars are covered with an atomic layer deposition (ALD) layer,
one of the application electrodes is provided so as to face a region on one long side of the inner edge of the support electrode and two beam portions along the long side thereof, and the other application electrode is provided so as to face a region on the other long side of the inner edge of the support electrode and two beam portions along the long side thereof,
the ALD layer has a thickness of 0.5 nm to 40 nm, and
the scanning mirror is configured such that the mirror portion can be rotated around an axis extending along the torsion bar when torsional force is applied to the torsion bar.

2. The scanning mirror according to claim 1, further comprising:
the surfaces of the support electrode and the application electrodes are covered with the ALD layer,
the support electrode, the beam portions, and the application electrodes form an electrostatic actuator, the electrostatic actuator being provided to be deformable so that torsional force is applied to the torsion bar when an AC voltage shifted in phase by $\pi$ is applied to the application electrodes.

3. The scanning mirror according to claim 1, wherein the ALD layer is made of an insulator.

4. The scanning mirror according to claim 1, wherein the ALD layer is made of any one or more of an aluminum oxide ($Al_2O_3$), an aluminum nitride (AlN), a silicon nitride ($Si_3N_4$), a silicon carbide (SiC), a gallium nitride (GaN).

5. The scanning mirror according to claim 1, wherein the mirror portion and the torsion bar are made of silicon (Si).

6. A manufacturing method for a scanning mirror comprising:
a support electrode having a rectangular frame shape;
four beam portions arranged so that two beam portions are arranged side by side along a pair of long sides of a rectangular inner edge of the support electrode and are connected to the support electrode on the central portion side of the long side of the inner edge;
two connecting bars provided so as to connect the beam portions facing each other on one short side and the other short side of the inner edge of the support electrode, respectively;
a mirror portion;
a torsion bar being parallel to each long side of the inner edge of the support electrode, and each provided so as to connect the central portion of each connecting bar and the mirror portion, and provided so as to support the mirror portion;
two application electrodes provided in portions facing the support electrode and the beam portions, wherein
one of the application electrodes is provided so as to face a region on one long side of the inner edge of the support electrode and two beam portions along the long side thereof, and the other application electrode is provided so as to face a region on the other long side of the inner edge of the support electrode and two beam portions along the long side thereof,
the mirror portion can be rotated around an axis extending along a torsion bar when torsional force is applied to the torsion bar provided so as to support the mirror portion, the manufacturing method comprising:
forming an atomic layer deposition (ALD) layer, with a thickness of 0.5 nm to 40 nm, at least on a surface of the beam portions, the connection bars and the torsion bar by an atomic layer deposition method after the support electrode, the beam portions, the connecting bars, the mirror portion, the torsion bar and the application electrodes are formed.

7. The manufacturing method for the scanning mirror according to claim 6, wherein
the scanning mirror has an electrostatic actuator which is formed of the support electrode, the beam portions, and the application electrodes, and the electrostatic actuator is provided to be deformable so that torsional force is applied to the torsion bar when an AC voltage shifted in phase by $\pi$ is applied to the application electrodes, and
the ALD layer is also formed on the surfaces of the support electrode and the application electrodes by an atomic layer deposition method.

* * * * *